(12) United States Patent
Brokken et al.

(10) Patent No.: US 9,368,709 B2
(45) Date of Patent: Jun. 14, 2016

(54) ELECTROACTIVE POLYMER ACTUATOR INCLUDING ELEMENTS WITH DIFFERENT ELASTIC MODULI

(75) Inventors: Dirk Brokken, Eindhoven (NL); Hendrik De Koning, Eindhoven (NL); Wendy Mirelle Martam, Eindhoven (NL); Floris Maria Hermansz Crompvoets, Eindhoven (NL); Juergen Vogt, Eindhoven (NL); Frank Vossen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 436 days.

(21) Appl. No.: 13/821,041
(22) PCT Filed: Aug. 31, 2011
(86) PCT No.: PCT/IB2011/053805
§ 371 (c)(1),
(2), (4) Date: Mar. 6, 2013
(87) PCT Pub. No.: WO2012/032437
PCT Pub. Date: Mar. 15, 2012

(65) Prior Publication Data
US 2013/0175898 A1 Jul. 11, 2013

(30) Foreign Application Priority Data
Sep. 9, 2010 (EP) ..................................... 10175960

(51) Int. Cl.
*H01L 41/04* (2006.01)
*H01L 41/047* (2006.01)
(Continued)

(52) U.S. Cl.
CPC .......... *H01L 41/047* (2013.01); *G02B 26/0825* (2013.01); *H01L 41/0478* (2013.01); *H01L 41/0986* (2013.01); *H01L 41/193* (2013.01)

(58) Field of Classification Search
CPC ............................. H01L 41/047; H01L 41/04
USPC ......................................... 310/300, 301–310
See application file for complete search history.

(56) References Cited

U.S. PATENT DOCUMENTS

2008/0129792 A1* 6/2008 McAvoy et al. ................ 347/61
2008/0289952 A1* 11/2008 Pelrine et al. ................. 204/165
(Continued)

FOREIGN PATENT DOCUMENTS

JP 2005033991 A 2/2006
JP 2007534283 A 11/2007
(Continued)

OTHER PUBLICATIONS

R.D. Kornbluh, "Shpae Control of Large Lightweight Mirrors With Dielectric Elastomer Actuation" Smart Structures and Materials 2003. Electroactive Polymer Actuators and Devices (EAPAD), Mar. 3-6, 2002, San Diego, CA, USA, Proceedings of SPIE, vol. 5051, 2003, pp. 143-158.
(Continued)

*Primary Examiner* — Michael Andrews
(74) *Attorney, Agent, or Firm* — Meenakshy Chakravorty

(57) ABSTRACT

An actuator comprises an electroactive polymer layer (402) and a stretchable electrode structure (403) disposed at a first side of the electroactive polymer layer and further a counter electrode layer (401) disposed on a second side of the electroactive polymer layer, wherein the ratio $Y_C/Y_{EAP}$ of the elastic modulus $Y_C$ of the counter electrode layer and the elastic modulus $Y_{EAP}$ of the electroactive polymer layer is at least 10. When compressed transversally by the electrodes, the electroactive polymer will expand tangentially and the actuator will relax into a shape wherein the interior of the electroded region is substantially recessed parallel to the plane of the device, while a substantial portion of the area increase is absorbed by out-of-plane bends arising at the electrode boundary (duck mode). The invention can be embodied as optically reflective or refractive devices with variable geometry.

15 Claims, 3 Drawing Sheets

(51) Int. Cl.
*G02B 26/08* (2006.01)
*H01L 41/09* (2006.01)
*H01L 41/193* (2006.01)

(56) References Cited

U.S. PATENT DOCUMENTS

2009/0021884 A1* 1/2009 Nakamura .................... 361/233
2012/0206248 A1* 8/2012 Biggs ............................ 310/300

FOREIGN PATENT DOCUMENTS

JP 2008253058 A 10/2008
WO 2008010713 A1 1/2008
WO 2008076846 A2 6/2008

OTHER PUBLICATIONS

K. Jung et al. Development of Soft-Actuator-Based Wearable Tactile Display IEEE Trans. Robotics, vol. 24, No. 3, Jun. 2008, pp. 549-558.
H. Prahlad et al. "Programmable Surface Deformation: Thickness-Mode Electroactive Polymer Actuatiors and Their Applications" Smart Structures and Materials 2005: Electroactive Polymer Actuators and Devices (EAPAD) Edited by Yoseph Bar-Cohen, Proceedings of SPIE vol. 5759 (SPIE), Bellingham, WA, 2005 pp. 102-113.

* cited by examiner

ELECTROACTIVE POLYMER ACTUATOR INCLUDING ELEMENTS WITH DIFFERENT ELASTIC MODULI

FIELD OF THE INVENTION

The invention disclosed herein generally relates to electroactive polymer actuators. In particular, it relates to an actuator with an asymmetric layered structure, including one multifunctional electrode, with a capacity for localized out-of-plane actuation.

The invention also relates to a method of manufacturing such an actuator.

BACKGROUND OF THE INVENTION

Dielectric actuators in the form of laminates (or sandwich structures or layered materials) belong to a rapidly evolving field of technology. A simple dielectric actuator may comprise a layer of electroactive polymer (EAP) and an electrode pair for applying an electrostatic force and thereby causing an elastic deformation of the polymer layer in the tangential (in-plane) and/or transversal (out-of-plane) direction. More sophisticated dielectric actuators may include additional functional layers, such as optically reflective or antireflective layers, texture-enhancing layers, electrically and/or thermally conductive layers, etc.

The way in which a dielectric actuator responds to an applied electric field may be influenced by the addition of passive layers. The application published as U.S. 2008/0289952 discloses an actuator coated with one or more passive polymer layers. The passive layers respond indirectly to variations in the actuating field under the action of shearing forces exerted on them by the actuator. Thus, as shown in FIG. 1 of the present application, expansion of an active area D between the electrodes E1, E2 of the actuator stretches the passive layers PL1, PL2 so that an elevated edge, corresponding to the boundary of the active area D, is produced on an external surface TDS of the laminate TDU. (It is noted that the visible difference in size of the electrodes E1, E2 is not a feature common to all actuators of this type.) To further illustrate such stretch mode movement, FIG. 2 shows how compression—and accompanying planar stretching—of that portion of an EAP layer 202 which is located between two electrodes 210, 211 causes an amplified thickness contraction of surrounding passive layers 210, 211 by the Poisson effect. The material making up the elevated edge is supplied from the active area by stretching the latter into a thinner shape; such stretching may not be acceptable in all applications.

Koo, Jung et al., Development of soft-actuator-based wearable tactile display, *IEEE Trans. Robotics*, vol. 24, no. 3 (June 2008), pp. 549-558 discloses a dielectric actuator, a portion of which is capable of buckling movement, as shown by FIG. 3 of the present application. The active portion 320 of the actuator 302, 310, 311 is clamped inside a rigid boundary frame (not shown), thus not in elastic contact with the surrounding portion 321. The clamping restricts tangential expansion and causes the actuator to deflect out-of-plane instead, a preferred direction of buckling being defined by the presence of a passive layer 301. While actuators of this type may achieve a relatively large deflection amplitude, they are generally unable to produce sharp edges, hence not ideal for tactile applications. Further, it has turned out that buckling-mode actuators perform best for symmetric shapes, such as square-shaped or round shapes, and will therefore not be compatible with too irregular electrode shapes.

SUMMARY OF THE INVENTION

It is an object of the present invention to overcome these limitations, and to provide an actuator with an actuation mode for producing relatively sharp edges while expanding in-plane only to a limited extent. A second object is to achieve this by a structurally simple actuator without added further layers. Yet another object is to provide an efficient method for manufacturing such actuator.

According to a first aspect of the invention, at least one of these objects is achieved by an actuator comprising an electroactive polymer (EAP) layer and a stretchable electrode structure disposed on a first side of the EAP layer. The electrode structure is stretchable (or softer) in the sense that its elastic modulus (or Young's modulus) is less than or substantially equal to the elastic modulus of the EAP layer. The electrode structure need not cover the first side of the EAP layer, but may be latticed or perforated. According to the invention, the actuator further comprises a counter electrode layer disposed on a second side of the EAP layer. The counter electrode layer is stiffer than the EAP layer, with its elastic modulus being at least 10 times as great as that of the EAP layer, preferably at least 50, more preferably at least 100, even more preferably at least 200, and most preferably at least 500. (In the case of anisotropic materials, the elastic moduli for tangential (in-plane) deformations are the most relevant ones.)

When the electrode structures apply a voltage across the EAP layer in what will be referred to as an active region thereof, the active region will compress transversally and tend to increase its area. Since the counter electrode layer is stiffer than the stretchable electrode structure, the actuator will deform in a localized manner. More precisely, the deformation will be localized to the active region and its immediate vicinity, so that the interior of this region is shifted out-of-plane while maintaining an orientation substantially parallel to its original position. A zone at and around the boundary of the active region will to some extent run in the thickness direction, and will generally be oriented non-parallel to the plane of the actuator. By virtue of the bending of its boundary zone, the EAP layer under compression can relax into an equilibrium state substantially without causing its surroundings to deform; thus, and partly due to the stiffer counter electrode layer, the size expansion induced by the electric field will be substantially localized to the active region and a large portion thereof is absorbed by the boundary zone's outward extension from the plane of the EAP layer. By providing an actuator with the ability to deform in this manner, referred to as duck mode deformation in what follows, the invention fulfils its first and second objects.

Without acquiescing to a particular theoretic model, it is believed that one of the mechanisms facilitating this localized out-of-plane deformation is the fact that Maxwell stress (in all three dimensions) arises in the active region but not beyond this. Hence, sharp edges are more likely to appear if the electrode edges are well-defined. The EAP layer expands more easily towards the free electrode, which is not proximate to the passive layer, and will therefore be located on the convex side of the relaxed configuration of a laminate to which an electric field is applied.

An advantage of the invention lies in that it produces a significant vertical amplitude (deep topography) at a small energy expense. This is because, in comparison with stretch-mode actuators with a thickness enhancement layer on a 'user' side, a smaller quantity of material is relocated. This is a consequence of the fact that the thickness enhancement layer in an actuated stretch-mode actuator is deformed into a configuration where it has smaller thickness than in the relaxed state. The two sides of the enhancement layer approach one another. In contrast, actuators according to the invention may create texture-enhancing edges by shifting a bounded region out-of-plane in substantially one single (transversal) direction; the two sides of the layer are displaced essentially parallel to one another. Thus, the invention achieves a comparable texture enhancement, at least from a tactile point of view, while operating at lower local stresses, so that the required peak voltage is lower and the life-cycle energy consumption is decreased. Also, larger deformations can be reached at the same voltage.

Another advantage of the invention, in comparison with actuators of the type disclosed in U.S. 2008/0289952, is that use of pre-strained actuator films is non-imperative. This simplifies the manufacture. Pre-straining favours stretch-mode deformation and accompanying formation of elevated edges rather than duck-mode deformation; for instance, pre-straining may contribute to a thickening of the EAP layer around the boundary of the active region.

Yet another advantage is that it is also not imperative to use electrodes which are stretchable in the tangential (in-plane) direction, for in duck mode, the edges are created by a portion of the passive layer dropping down, not by stretching the passive layer tangentially. This provides the designer with a greater freedom; in particular, since the electrodes may then be provided in the form of stable, substantially non-stretching surfaces, a reflective surface can be arranged directly onto the actuator.

As another advantage, the invention allows for sub-second switching times. In some examples, a switching frequency of up to 1000 Hz has been experimentally measured.

The in-plane size expansion will normally be more localized for an actuator made up of materials with smaller bending stiffness, that is, materials that are thin and/or have small shear modulus. This relationship is applicable to all constituents of the actuator, and particularly to the respective electrode layers which are often influential, in a given combination of actuator materials, to the sharpness of edges.

It is noted that the counter electrode layer is multifunctional—it acts both as an electric conductor and as a stiffening layer granting the actuator its characteristic mechanical properties—and thereby promotes the structural compactness of the actuator. The counter electrode layer further serves to protect the soft EAP layer, which would normally feel sticky when touched by a human finger. A similar protection would not be achieved by the stretchable electrode, as this is thinner, softer and not always solid.

In a second aspect, the invention provides a method for manufacturing the actuator according to the first aspect. By the method, the actuator to be produced is conceptually divided into two or more sub-laminates to be manufactured separately. Each sub-laminate comprises one or more layers and is provided by separate—and possibly parallel—procedures, either by direct manufacture or by obtaining prefabricated materials. After preparation of the sub-laminates, the latter are laminated together to form the actuator. The laminations may take place by mechanical compression, chemical bonding, thermal or acoustic soldering, use of unaided adhesion of surfaces (such as by van der Waals' forces) or some other lamination method known per se in the art. With reference to the third object of the invention, this method improves efficiency particularly if at least one of the sub-laminates includes a plurality of bonded layers, comprises a temperature-treated constituent, a composition cured by heat, radiation or chemical additives, a monoaxially or biaxially pre-stretched layer, a layer manufactured by coating a pre-stretched substrate, or any other constituent manufactured in a time-consuming manner or requiring to be manufactured physically separated from at least one other manufacturing step to avoid contamination or temperature-induced damage.

In one embodiment, the (tangential) elastic modulus of the counter electrode layer is at least 50 times as great as the modulus of the EAP layer, such as at least 100 times as great, such as at least 200 times as great, such as at least 500 times as great.

In one embodiment, the product of the (tangential) elastic modulus and thickness of the counter electrode layer is at least 2 times as great as the modulus of the EAP layer, such as at least 10 times as great, such as at least 50 times as great, such as at least 100 times as great. For some materials, it has been found that softness, stretchability, stiffness and related mechanical properties are reflected more faithfully by values of a stiffness index which is the product of the thickness and the elastic modulus, d×Y (dimension: force per unit length). For such materials, the statement that a counter electrode layer is stiffer than an EAP layer will be equivalent to saying that the counter electrode layer has a greater stiffness index than the EAP layer, that is, $d_c \times Y_c > d_{EAP} \times Y_{EAP}$.

In one embodiment, the counter electrode layer has approximately such (tangential) stiffness as is produced by a 1.5 μm layer of a material with an elastic modulus of around 4 GPa.

In one embodiment, an actuator comprises, in addition to the one stretchable electrode already described, one counter electrode layer which is mechanically uniform in all tangential (in-plane) directions. In contrast to this, available buckling-mode actuators include layers with a constrained tangential expandability, wherein such layers are in general affixed to the EAP layer. The constraint may be caused by elastic properties varying over the surface or by stiff or rigid elements disposed within in the material. As this would make the actuator prone to deform in the buckling mode rather than the desired duck mode, the present embodiment has a uniform counter electrode layer.

In one embodiment, the EAP layer in the actuator layer comprises a composition containing at least one material chosen from the following list:
  acrylic, e.g., 3M™ VHB™ tape,
  poly[styrene-b-(ethylene-co-butylene)-b-styrene],
  polyurethane,
  polyvinyl chloride,
  silicone, e.g., silicone rubber.

These materials have demonstrated advantageous properties as EAP materials. For one thing, they have a Poisson ratio equal or close to 0.5, which ensures near-incompressible behavior, by which tangential contraction takes place jointly with transversal expansion and vice versa. In examples, they have experimentally been found to behave in duck mode when combined with a passive layer as in the embodiments previously mentioned.

In one embodiment, the stretchable electrode structure comprises a composition containing at least one material chosen from the following list:
  carbon black,
  carbon nanotubes,
  graphene,
  poly-aniline (PANI), and
  poly(3,4-ethylenedioxythiophene) (PEDOT), e.g., poly(3,4-ethylenedioxythiophene) poly(styrenesulfonate) (PEDOT: PSS).

These layers have a low elastic stiffness and cooperate well with a typical EAP layer. Graphene, PANI, PEDOT and PEDOT:PSS are highly (though not necessarily completely) transparent, or can be applied as highly transparent layers, and are therefore suitable for optical (refractive) applications.

In one embodiment, the counter electrode comprises an optically reflective surface, such as a surface coated with metal, e.g., by vapor deposition. Alternatively, it may be made of an optically reflective material, such as a material having a content of reflective particles. In this embodiment, the counter electrode layer fulfils a threefold purpose and hence contributes positively to the simplicity of the actuator structure. If the counter electrode is made of a transparent material, the reflective layer may be located either on the side facing inwardly (that is, facing the EAP layer) or on the side facing outwardly. The reflective surface is adapted to reflect electromagnetic radiation in a predetermined wavelength range. Suitably, the reflective surface is substantially smooth for measuring or imaging purposes, while a simpler surface finish may be adequate if the reflector serves the "non-imaging optics" purpose of beam steering, beam shaping, redirecting heat radiation, concentrating light for illumination etc. The geometry of the reflector is adjustable by varying the voltage applied between the electrodes of the actuator, which means that such reflector is functionally equivalent to several fixed reflectors. In particular, the angle of the reflecting surface can be adjusted so that the geometry of reflected rays—particularly their direction of propagation—can be controlled. Adjustable reflectors of this kind may have a curved shape already in their relaxed state, e.g., forming a concavely shaped top surface, such as a spherical or parabolic surface.

In a further development of the preceding embodiment, the optically reflective surface is provided on the side facing outwardly, thus on the outside of the actuator as a whole. An advantage of such a structure is that the light does not travel through the counter electrode material before and after reflection, which could otherwise imply a color shift, a general attenuation or other undesirable alterations.

As an alternative, the reflective layer is arranged on the inside, facing the EAP layer. If the reflective layer is the only electrically live layer of the counter electrode and the transparent layer is electrically insulating, then the latter may act as a protection of the user.

In one embodiment, the counter electrode layer is polymeric. It may be a metalized polyester film, such as metalized polyethylene terephthalate (PET). In particular, aluminum-coated Mylar® or Steinerfilm® may be used. Suitably, the metallic coating is so thin and/or mechanically similar that it has a limited influence on the mechanical properties of the counter electrode layer. For instance, the reflective layer is compliant to bending, so as not to restrict duck-mode behavior.

In one embodiment, the counter electrode layer is relatively thin. This ensures sufficient compliancy, so that sharp edges appearing, e.g., at a boundary of the active electroded region are allowed to form at the surface of the actuator. The counter-electrode material chosen is preferably matched to the desired thickness of the counter electrode layer, so that a suitable (tangential) stiffness is achieved. In particular, the thickness may be at most 10 µm. Preferably, it is at most 5 µm and most preferably at most 2 µm.

In one embodiment, the actuator of the invention further comprises a passive layer that is arranged on that side of the electroactive polymer layer where the stretchable electrode structure is disposed, that is, facing away from the surface on which the elevated or tactile structure is to be produced. Indeed, the passive layer is primarily intended to form a support layer to fix the actuator to a substrate. For practical purposes, the substrate can be regarded as rigid. In most embodiments, it is not intended as a texture or thickness enhancement layer. The substrate may be a rigid surface, e.g., a portion of a housing of an apparatus for which the actuator serves as input or output device. With this structure, clearly, the counter electrode layer still forms the outer surface of the actuator, thereby protecting the softer layers from being touched.

To fulfill its purpose as a support and/or mounting layer, the passive layer is preferably quite soft, so as not to influence the actuator's movements in response to an applied electric field. In particular, the passive layer may comprise a soft elastomer and/or a soft foam.

Preferably, the thickness of the passive layer is greater than or substantially equal to the thickness of the EAP layer. This is advantageous, especially when a soft passive layer is used, as even large deformations will not substantially influence the local resilience of the passive layer.

In one embodiment, the passive layer is mechanically uniform, at least in all tangential directions. Unlike non-uniform passive layers, which sometimes form part of available buckling-mode actuators to restrain their expandability, such a uniform passive layer furthers movement in the duck mode.

In one embodiment, the passive layer is solid and made of a soft foam material.

In one embodiment, a non-solid passive layer functions as a support layer. For instance, the support layer may be disposed only at the edges of the actuator, so that the actuator is freely suspended between the edges. As an alternative, the passive layer is disposed under the actuator but contains cavities (through holes extending in the transversal direction) at the active regions, in which a deformation can occur. A non-solid passive layer arranged in this manner provides support while interfering to a minimal extent with the actuator's capacity to deform.

It is noted that the invention relates to all possible combinations of features recited in the claims.

BRIEF DESCRIPTION OF THE DRAWINGS

This and other aspects of the present invention will now be described in more detail, with reference to the appended drawings showing embodiments of the invention, on which.

It is pointed out that the figures are in general not to scale. Unless otherwise indicated, the upward and downward directions on a drawing do not necessarily correspond to the orientation of the gravitational field.

DETAILED DESCRIPTION OF THE EMBODIMENTS

Figure 1:
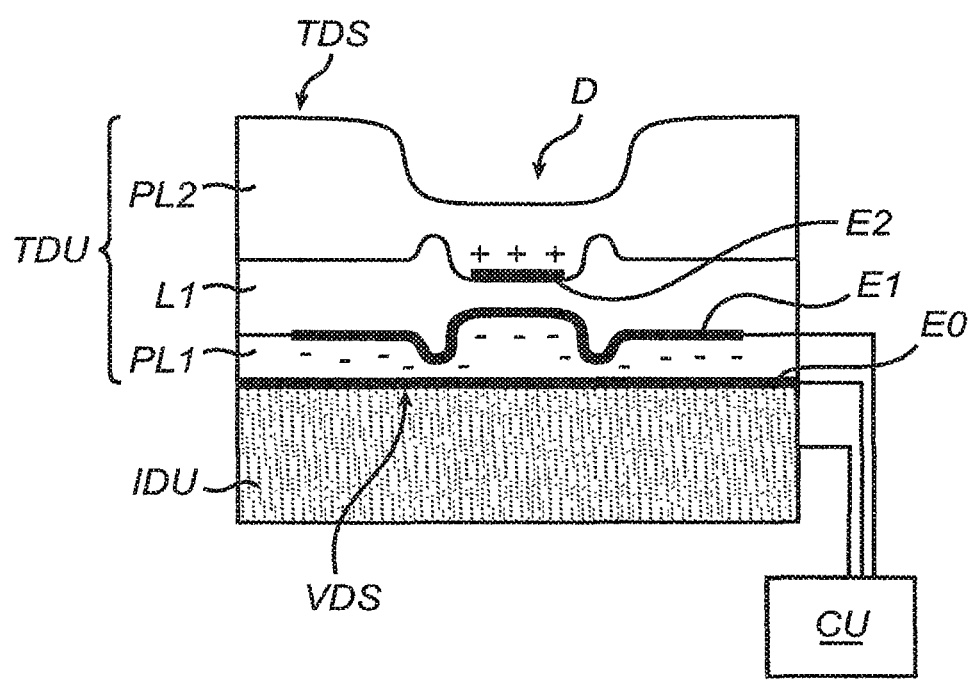
FIGS. 1 and 2 show available actuators with passive layers for movement in a stretch mode.
Figure 2:
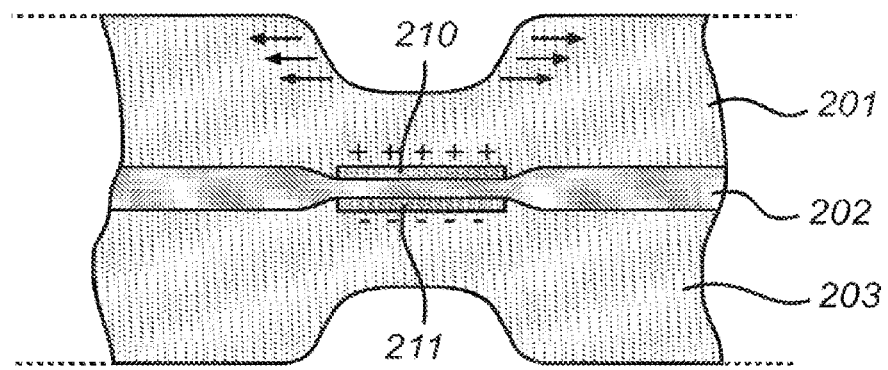
Figure 3:
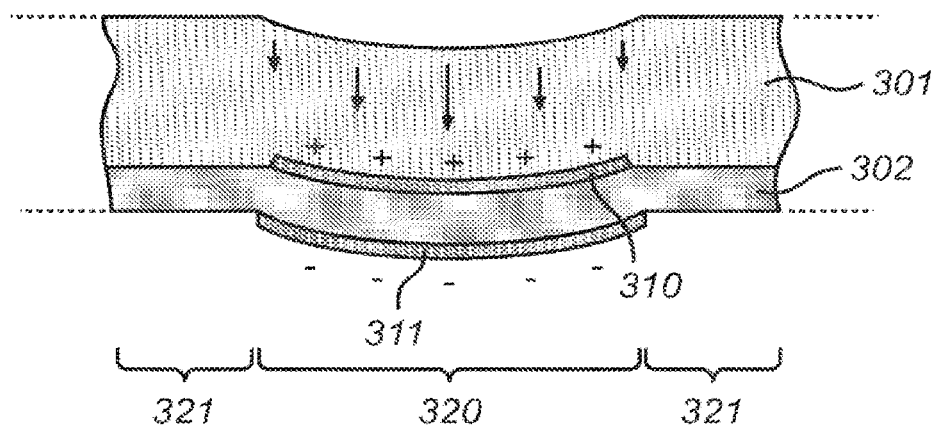
FIG. 3 shows an available actuator with passive layer and a portion having restrained tangential expandability, for movement in a buckling mode.
Figure 4:
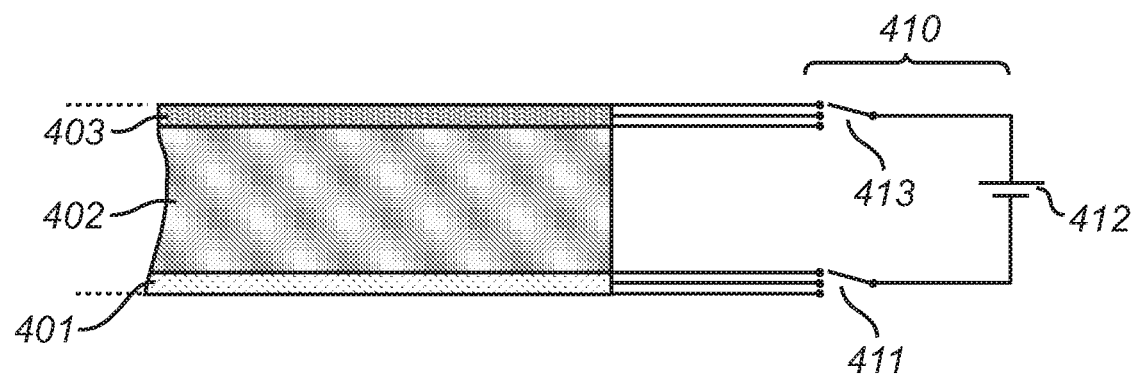
FIG. 4 shows an actuator according to an embodiment of the invention in a rest mode.

FIG. 4 is a cross-sectional view of an actuator according to an embodiment of the present invention. On one side of a layer 402 of an electroactive polymer (EAP), with characteristics that have been discussed in preceding sections, is disposed a stretchable electrode structure 403. The structure 403 is shown on the drawing as a solid layer covering the top side of the EAP layer 402 but may, however, be embodied as an openwork structure, e.g., a lattice of intersecting elongated tabs or tongues having a total density suitably chosen to unite a low overall elastic stiffness with an adequate (tangential) uniformity of the applied electric field. Suitable materials for the stretchable electrode structure have been exemplified above. The actuator further comprises a counter electrode layer 401 secured to the EAP layer 402. The counter electrode layer 401 is electrically conductive and differs from the stretchable electrode structure 403 primarily by being substantially stiffer, at least in the tangential (in-plane) direction. Guidelines for the choice of mechanical properties of the counter electrode material have been given above; for instance, the elastic modulus of the counter electrode may be above 1 GPa, suitably about 4 GPa, while the elastic modulus of the EAP may be in the range from 10 kPa to 5 MPa. Together with a power unit 410, the stretchable electrode structure 403 and the counter electrode layer 401 are operable to apply an electric field across the EAP layer 402. As further shown in FIG. 4, each of the electrodes 401, 403 is segmented into a plurality of alternative regions which can be selected using respective switches 411, 413 for connecting a region to a voltage source 412 in the power unit 410.

Figure 5:
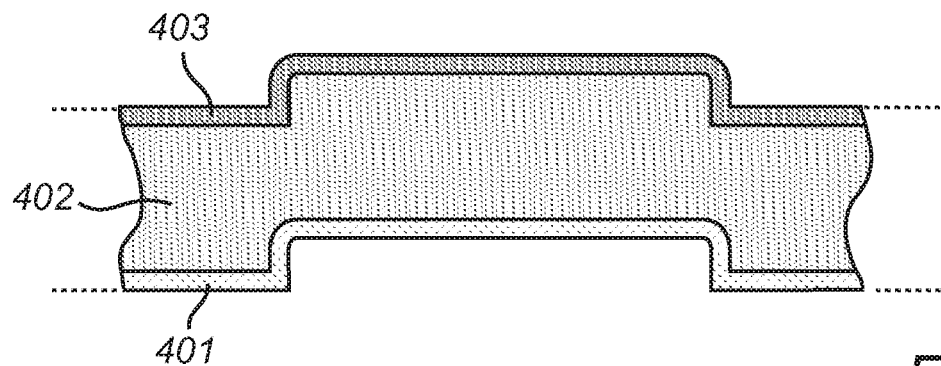
FIG. 5 shows the actuator of FIG. 4 in an actuated mode.

FIG. 5 shows the actuator of FIG. 4 in an actuated state, in which a non-zero electric field induces a deformation of the EAP layer 402 into reduced thickness and, by incompressibility, into greater surface area. The actuator relaxes into the shape shown on the drawing, wherein a portion of the surface-area increase is absorbed by the fact that the boundary zone of the selected active region extends outwardly from the plane of the EAP layer 402, thereby limiting the in-plane expansion around the active region. Notable are the relatively sharp corners along the boundary zone of the active region, in which the voltage is applied. These corners give rise to an embossed pattern on the top surface of the actuator.

To manufacture the actuator shown in FIGS. 4 and 5, one may proceed according to the example given below or one of its possible variations.

Figure 6:
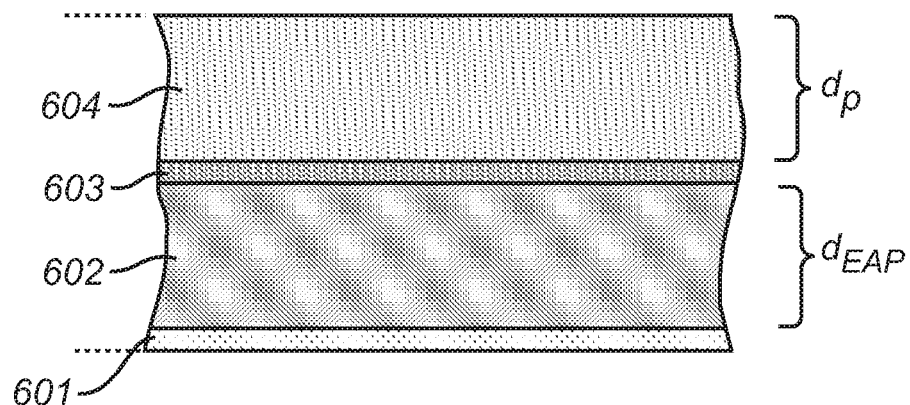
FIG. 6 shows an actuator including a passive layer, in accordance with an embodiment of the invention.

FIG. 6 is a cross-sectional view of an actuator. The actuator consists of a counter electrode layer 601, an EAP layer 602 of thickness $d_p$ and a stretchable electrode structure 603. The actuator further comprises a passive layer 604 that is secured to the stretchable-electrode side of the actuator and has thickness $d_{EAP}$. The passive layer 604 is preferably somewhat thicker than the EAP layer 602, so as to allow the actuator to deform in an unrestricted manner even if the passive layer 604 is attached to a substrate (not shown) located on the top side of the actuator on this drawing. Indeed, at large transversal compression of the passive layer 604 between the actuator and the substrate, the passive layer 604 may locally exert an appreciable reactive force onto the actuator, thus deviating from its intended purpose to support the actuator in a neutral and even fashion.

The actuator shown in FIG. 6 can be manufactured in a similar fashion as that of FIG. 4, either with a reflective (e.g., metalized) or non-reflective counter electrode layer. The passive layer 604 may be deposited and cured directly on top of the stretchable electrode structure 603 as long as this operation does not involve chemical substances, radiation, temperature or other treatments that are potentially harmful to the actuator. As an alternative, the passive layer 604 is manufactured in a separate process and is then bonded to the actuator. The latter alternative is likely to reduce the time required for manufacturing and may also be advantageous in that it limits contamination and damages to those layers of the laminate which are already finalized.

The passive layer 604 may generally consist of the same material as the EAP layer 602 or of a similar material. Preferably, the passive layer 604 is as soft as, or softer than, the EAP layer 602. The passive layer 604 may for instance be made of a soft elastomer, such as Silastic®. When choosing the passive layer material, one may also take into account its capacity to bond to the intended substrate.

Although symbolically shown as a solid body on the drawing, the passive layer 604 may comprise one or more cavities. As one example, cavities may be provided next to each active region (or each separately operable electrode portion). Hence, in the particular case that the actuator is deployed in a horizontal position, there is a cavity immediately above or below each active region. As another example, one cavity may extend over all active regions, so that the actuator is supported (retained) mainly at its edges. If the support layer 604 comprises cavities, then preferably these are aligned with the active regions of the respective electrodes before the support layer 604 is secured to the actuator.

It is contemplated to apply the present invention to adaptive optics, in particular adaptive lighting applications. For example, luminaires may be provided with adaptive mirrors allowing the emitted light to be redirected spatially. When transparent electrode and EAP materials are chosen, the invention can also be embodied as an adjustable refractive element. Moreover, the top layer of the actuator can be used to realize a tactile surface for interaction with a user, such as a touch screen with a topography of elevated buttons.

The person skilled in the art realizes that the present invention by no means is limited to the preferred embodiments described above. On the contrary, many modifications and variations are possible within the scope of the appended claims. For example, the embodiments disclosed in this application may be varied by substituting materials or adding further layers and may nevertheless by virtue of the asymmetry of the new structures exhibit a duck-mode-like behavior when energized.

Example

Without being limited thereto, the invention will be illustrated by an example concerning an actuator of the type shown in FIGS. 4 and 5.

An EAP film in the form of a 80-μm layer of Nusil® CF19-2186 was made by doctor-blade coating on a suitable surface, e.g., a Teflon® plate. After curing in an oven, a well-performing dielectric actuation film was obtained. Secondly, a stretchable electrode was disposed on one side of the dielectric film. For the purposes of this application, "stretchable" particularly means that it can significantly change in length without significant material failures, such as mechanical rupture or loss of conductivity. In this example, the stretchable electrode was made of carbon black. On the other side of the dielectric film, aluminum-coated Mylar® foil of 1.5 μm thickness was deposited (draped) to serve both as the counter electrode and as a reflective surface. The Mylar® foil was applied with its reflective surface on the outside, as this gives a more neutral reflection, unaffected by the optical properties of the Mylar® film.

The actuator according to the above example behaved in duck mode, which was believed to be caused by the asymmetry of the system that the PET film introduced. In an active region, where an electric field was applied, the PET film would duck below the actuator plane in well-defined areas. In the particular case of a grid-shaped, non-solid stretchable electrode, the electric field would be strongest below the stripes making up the grid, where the electrode structures on each side overlap. In these regions of high electric field intensity, height differences of up to 30 μm and steep local bending angles were measured using an optical probe. If the stripes of the grid were disposed in a sparse fashion, there appeared intermediate regions in which the local electric field was not sufficiently strong to cause the actuator to deform. Even though the electric field is expected to vary continuously with respect to the tangential coordinate, the intermediate regions with an electric field below the actuation threshold were generally clearly delimited.

The above example may be varied with respect to:

the thickness of the EAP layer, which may range from 10 to 150 μm;

the choice of EAP material: generally soft dielectric elastomers can be used; alternatives to Nusil® are acrylics (such as 3M™ VHB™ 4905 or 4910), polyurethanes, polyvinyl chloride and several silicone rubbers (such as Wacker Elastosil® RT625, Dow Corning WL3010, WL5331, HS3, Sylgard® 186, 184);

the choice of stretchable electrode material: alternatives include PEDOT or carbon nanotubes; and the choice of counter electrode material, which could be replaced by Steinerfilm® or some other PET film, which is purchased as a manufactured article or is produced in a separate, possibly parallel, process.

The invention claimed is:

1. An actuator comprising:
   an electroactive polymer layer;
   a stretchable electrode structure disposed on a first side of the electroactive polymer;
   a counter electrode layer disposed on a second side of the electroactive polymer layer; and
   a passive layer that is secured to the first side of the electroactive polymer layer, the passive layer forming a support layer and fixing the actuator to a substrate,
   wherein the stretchable electrode structure has a tangential elastic modulus $Y_{e1}$ less than or substantially equal to the tangential elastic modulus $Y_{EAP}$ of the electroactive polymer layer, and
   wherein the ratio $Y_c/Y_{EAP}$ of the tangential elastic modulus $Y_c$ of the counter electrode layer and the tangential elastic modulus $Y_{EAP}$ of the electroactive polymer layer is at least 10.

2. The actuator of claim 1, wherein the counter electrode layer is mechanically uniform in all tangential directions.

3. The actuator of claim 1, wherein the electroactive polymer layer comprises a material selected from the group consisting of acrylic, poly[styrene-b-(ethylene-co-butylene)-b-styrene], polyurethane, polyvinyl chloride, and silicone.

4. The actuator of claim 1, wherein the stretchable electrode structure comprises a material selected from the group consisting of carbon black, carbon nanotubes, graphene, poly-aniline, and poly(3,4-ethylenedioxythiophene).

5. The actuator of claim 1, wherein the counter electrode layer comprises an optically reflective surface.

6. The actuator according to claim 5, wherein the optically reflective surface of the counter electrode layer is an external surface of the actuator.

7. The actuator of claim 1, wherein the counter electrode layer comprises a metalized polymer film.

8. The actuator of claim 1, wherein the thickness of the counter electrode layer is at most 10 μm.

9. The actuator of claim 1, wherein the passive layer is mechanically uniform in all tangential directions.

10. The actuator of claim 1, wherein the passive layer contains at least one cavity.

11. The actuator of claim 1, wherein the thickness of the passive layer is greater than or substantially equal to the thickness of the electroactive polymer layer.

12. The actuator of claim 1, wherein the passive layer comprises a soft elastomer.

13. The actuator of claim 1, wherein the counter electrode layer forms an external surface of the actuator.

14. The actuator of claim 1, wherein said counter electrode layer is compliant in that the counter electrode is configured to stretch when said actuator is actuated.

15. An actuator comprising:
   an electroactive polymer layer;
   a stretchable electrode structure disposed on a first side of the electroactive polymer;
   a counter electrode layer disposed on a second side of the electroactive polymer layer, wherein the counter electrode is compliant in that the counter electrode is configured to stretch when said actuator is actuated,
   wherein the stretchable electrode structure has a tangential elastic modulus $Y_{e1}$ less than or substantially equal to the tangential elastic modulus $Y_{EAP}$ of the electroactive polymer layer, and
   wherein the ratio $Y_c/Y_{EAP}$ of the tangential elastic modulus $Y_c$ of the counter electrode layer and the tangential elastic modulus $Y_{EAP}$ of the electroactive polymer layer is at least 10.

* * * * *